United States Patent [19]

Nakayama et al.

[11] Patent Number: 4,694,378
[45] Date of Patent: Sep. 15, 1987

[54] APPARATUS FOR COOLING INTEGRATED CIRCUIT CHIPS

[75] Inventors: Wataru Nakayama, Kashiwa; Shigeki Hirasawa; Tadakatsu Nakajima, both of Ibaraki, all of Japan

[73] Assignee: Hitachi, Ltd., Tokyo, Japan

[21] Appl. No.: 128

[22] Filed: Jan. 2, 1987

Related U.S. Application Data

[63] Continuation of Ser. No. 684,790, Dec. 21, 1984, abandoned.

[51] Int. Cl.⁴ .............................................. H05K 7/20
[52] U.S. Cl. ................................... 361/385; 165/80.4;
174/15 R; 357/82; 361/382
[58] Field of Search ............ 165/80.4, 104.33, 104.34;
174/15 R, 15 HP, 16 HS; 357/82; 361/385, 386

[56] References Cited

U.S. PATENT DOCUMENTS 3,858,090 12/1974 Lehmann ............................ 361/385
4,203,129 5/1980 Oktay et al. ........................ 357/82

FOREIGN PATENT DOCUMENTS 0009605 4/1980 European Pat. Off. ............. 357/82
0085556 5/1983 Japan ................................... 361/385
0894891 2/1981 U.S.S.R. ............................. 361/386
0999184 2/1983 U.S.S.R. ............................. 357/82

OTHER PUBLICATIONS

Chu et al., "Thermal Card and Deflector System for Augmenting Emersion Cooling", IBM Technical Disclosure Bulletin, vol. 10, No. 10, 3/68, pp. 1559-1560.

Primary Examiner—A. D. Pellinen
Assistant Examiner—Gregory D. Thompson
Attorney, Agent, or Firm—Antonelli, Terry & Wands

[57] ABSTRACT

A boiling type cooling structure for cooling semiconductor chips mounted on printed circuit cards, with a heat conductive stud being attached to the surface of each chip. Cooling plates with fins, arranged so as to surround the circumference of each heat conductive stud, are placed between the printed circuit cards in order to condense the vapor bubbles produced near the heat conductive studs.

4 Claims, 7 Drawing Figures

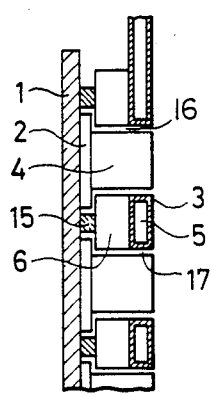
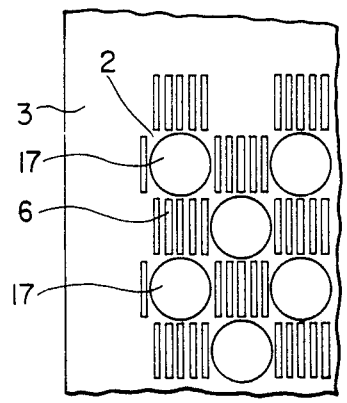
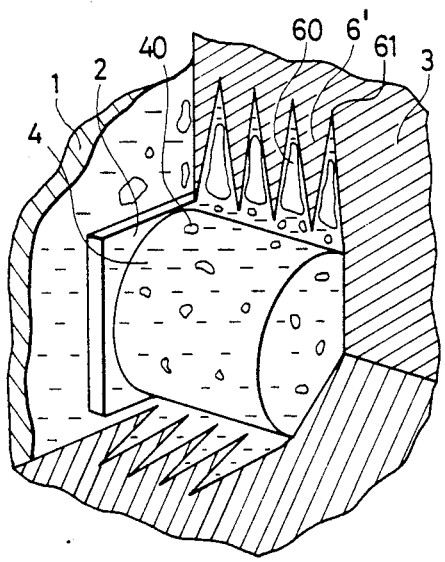

APPARATUS FOR COOLING INTEGRATED CIRCUIT CHIPS

This is a continuation of application Ser. No. 684,790, filed Dec. 21, 1984, now abandoned.

BACKGROUND OF THE INVENTION

The present invention relates to a cooling apparatus for integrated circuit chips for computers and for power semiconductors such as thyristors, and more specifically to a boiling type cooling apparatus.

A conventionally known boiling type cooling apparatus for IC chips, proposed in U.S. Pat. No. 4,203,129, includes chip-mounting printed circuit cards dipped longitudinally in a liquid. In this type of cooling apparatus, the vapor bubbles produced from the chip rise and condense to be collected in a lower liquid reservoir. At the same time the chip is cooled by transmitting the heat of the chip to the cooling plate through a heat conducting member including a piston.

Disadvantages of the above-noted conventional cooling apparatus resides in the fact that bubbles, produced by the semiconductor devices located at lower positions, move up along the printed circuit card to surround the upper semiconductor chips. Not only does this raise the possibility of producing dry patches on the upper chips, making it impossible to obtain high heat transfer coefficient, but there is also the possibility of burnout.

SUMMARY OF THE INVENTION

The aim underlying the present invention essentially resides in providing boiling type cooling apparatus which prevents the rising of bubbles and the liquid motion resulting from jolting during transport, and which provides uniform heat transfer coefficient for all integrated circuit chips mounted either on the upper or lower positions of the printed circuit card.

In accordance with the present invention is characterized in that the bubbles from the lower chips, generated during boiling, are trapped and condensed by fins which are provided for each chip, thereby preventing the bubbles from rising and reaching the upper chips.

For this purpose, a condensing device with a high heat transfer coefficient is provided for each chip, with the condensing device being formed by arranging a series of fins in such a manner so as to increase the condensing area or by providing pointed fine shaped fins about 0.1-2.0 mm in diameter. Advantageously to aid the boiling process, preferably, a stud is provided on the respective chips with the stud having a porous surface.

BRIEF DESCRIPTION OF THE DRAWINGS

FIG. 5 is a simplified vertical cross-section of another embodiment of this invention;

FIG. 6 is a front view of the cooling plate of FIG. 5 with chip studs, chips, printed circuit card and elastic members removed; and FIG. 7 is a perspective view, partially cut away, of another embodiment of the present invention.

DETAILED DESCRIPTION

Figure 1:
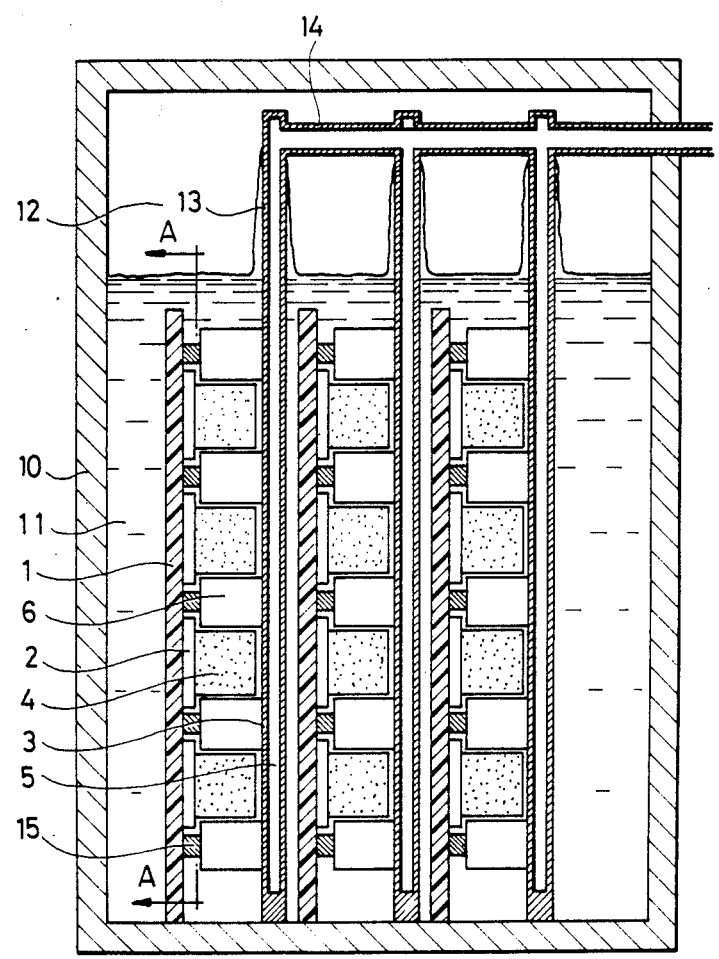
FIG. 1 is a simplified vertical cross section of the integrated circuit chip cooling apparatus, which is one embodiment of this invention.
Figure 2:
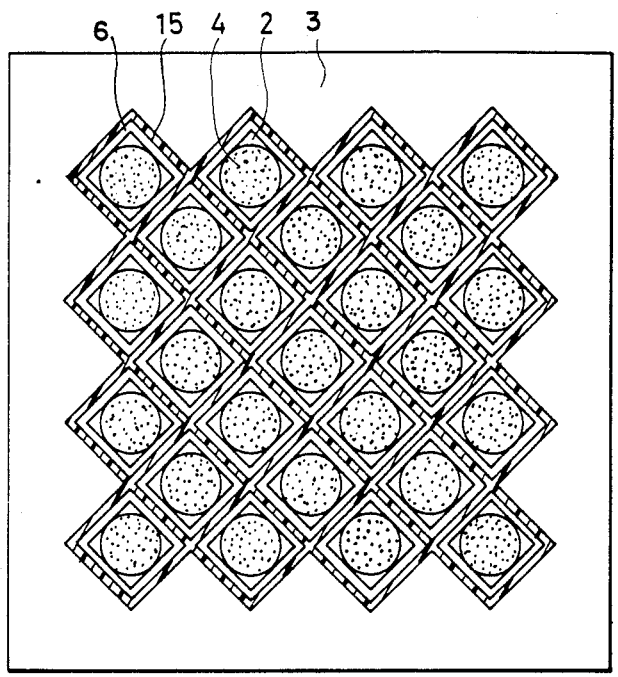
FIG. 2 is a cross-sectional view taken along the line A—A in FIG. 1 with the cooling plate removed.
Figure 3:
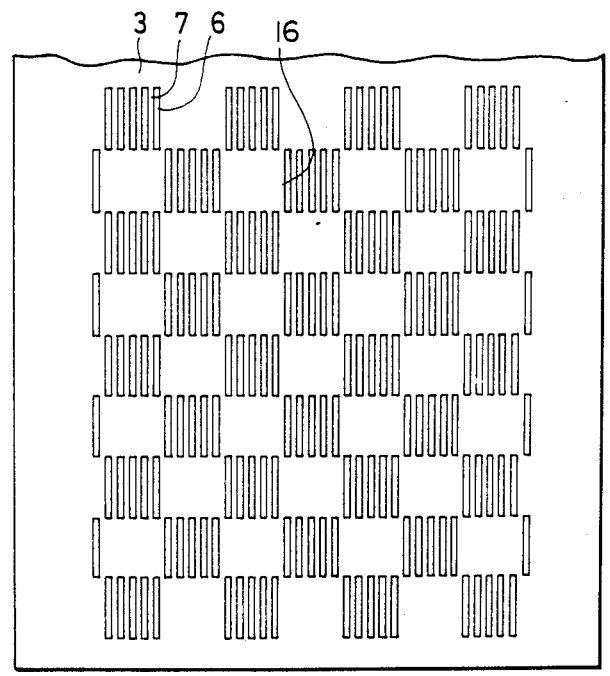
FIG. 3 is a front view of another embodiment of the present invention of the cooling plate of FIG. 1 with chip studs, chips, printed circuit card, and elastic members removed.

Referring now to the drawings wherein like reference numerals are used throughout the various views to designate like parts and, more particularly, to FIGS. 1-3, according to these figures, a printed circuit card or board 1 has a plurality of semiconductor chips mounted thereon, with a chip stud 4, of a cylindrical heat conducting member and having a porous surface, being secured to the top of each semiconductor chip 2. A fluid cooling plate 3 is inserted between adjacent printed circuit cards 1, with the flat cooling plate 3 including a cooling water passage 5. A large number of flat plate fins 6, arranged parallel to each other with small gaps there between, are attached to the cooling plate 3, with the flat plate fins 6 being arranged so as to enclose the chip stud 4 and all aligned parallel to the direction of gravity. The area where the chip stud 4 is inserted is a space 6. A plurality of printed circuit cards 1 and cooling plates 3 are alternated with each other and submerged in dielectric liquid 11 (such as flon, perfluorocarbon, alcohol) in the enclosed container 10.

A part of the cooling plate 3 extends upward into a vapor space 12 to form an auxiliary condensing surface 13. Water piping 14 is provided to introduce water into the cooling water passage 5 in the cooling plate 3. ;p It is desirable that an elastic member 15 be inserted between the end of the flat thin fins 6 and the printed circuit card 1 and that the semiconductor chip 2 and chip stud 4 be completely enclosed by the flat plate fins 6.

The heat produced by the semiconductor chip 2 is transmitted to the chip stud 4 and, through the porous surface of the chip stud 4, boils the volatile liquid 11. The vapor bubbles thus formed rise and enter the narrow gaps 7 between the flat plate fins 6 by a buoyant force. If a size of the gaps 7 is smaller than the bubble, the vapor directly contacts flat plate fins 6. The cooling water flowing in the passage 5 of the cooling plate 3 cools the cooling plate 3 and flat plate fins 6. Consequently, the vapor condenses into liquid at the fin surface of the flat plate fins 6. The condensed liquid is drawn down by the force of gravity and returns to the region around the stud 4. If there is an elastic member 15 provided between the end of the flat plate fins 6 and the printed circuit card 1, and if each semiconductor chip 2 and stud 4 are enclosed completely by flat plate fins 6, then all of the vapor bubbles produces at the chip stud 4 enter the narrow gaps 7 between the flat plate fins 6, which enhance the condensing heat transfer coefficient. Where all the flat plate fins 6 are equal in length in the direction of gravity, the vapor bubbles enter and are distributed almost uniformly, among all the gaps between the flat plate fins 6, improving the condensing heat transfer coefficient.

A part of the vapor that has passed through the fin gaps 7 collects in the vapor space 12 in the upper part of the enclosed container 10 where it is condensed by the auxiliary condensing surface 13.

With this embodiment, since vapor condensation is performed for each semiconductor chip, all semiconductor chips can be uniformly cooled.

The semiconductor chip is square with each side measuring 2 to 20 mm; the diameter of the chip stud is about the same as the side of the chip. The flat plate fins 6 attached to the cooling plate 3 have a thickness of about 0.1 to 1.0 mm, with the gap 7 between flat plate fins 6 being about 0.1 to 1.0 mm. The material of flat plate fins 6 is preferably has a high thermal conductivity and, may, for example, be copper, aluminum, and silicon carbide.

Figure 4:
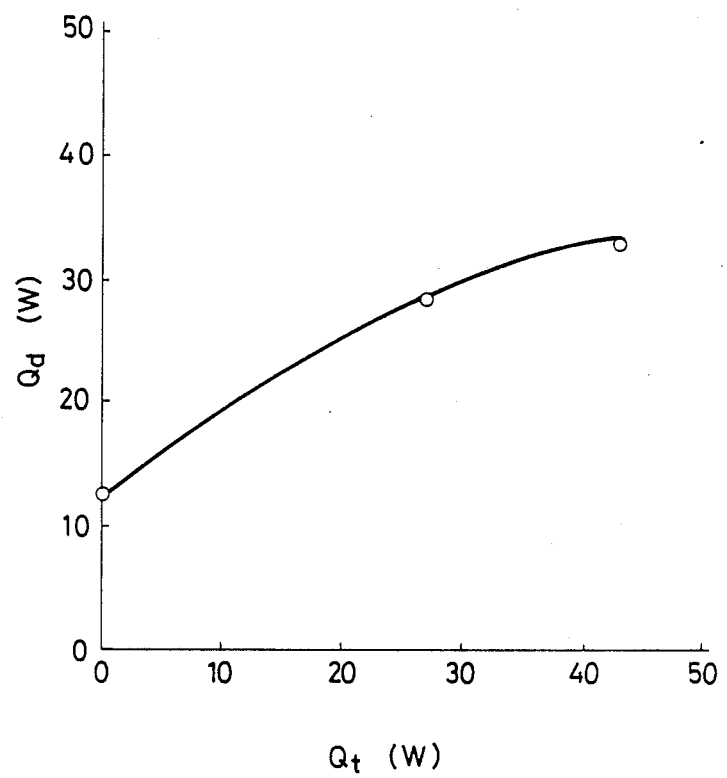
FIG. 4 is a diagram showing the characteristics of this invention.

FIG. 4 illustrates the result of experiments regarding the condensing heat conducting performance of the embodiment of FIG. 3. In the experiment, graphically illustrated in FIG. 4, the fin thickness of 0.3 mm; flat plate fin gaps 7 were 0.2 mm; flat plate fin length was 11 mm; flat plate fin height was 5.4 mm; the number of flat plate fins was 25; and the dielectric liquid was perfluoro normal hexane. The temperature difference between the dielectric liquid and the cooling plate 3 was about 12° C. Examining the relationship between the heat Qt generated by a single semiconductor chip 2 and the heat Qd removed from the fins 6, it can be seen that the cooling plate removes about 30 Watts (W) for each semiconductor chip 2. The reason that the heat Qd removed by the cooling plate 3 is greater than the heat Qt generated when the chip-generated heat Qt is below 30 Watts, is that the liquid is supercooled while condensation is taking place. Thus, the maximum removable heat, by condensing the flat plate fins 6 is about 30 watts in the experimental case of FIG. 4. If the heat Qt generated is greater than 30 Watts, the temperature differential between the dielectric liquid and the cooling water must be increased to about 12° C.

In FIGS. 5 and 6 holes 17 are formed through the cooling plate 3 to accommodate the chip stud 4 at positions where plate fins 6 are not provided. The cooling plate 3 and the chip stud 4 are equal in height to make the cooling structure small. Instead of flat plate fins 6, a large number of pin-like fins may be attached to the cooling plate 3.

In the embodiment shown in FIG. 7, spiral fins 6' having a triangular cross section, are attached to the cooling plate 3 and are formed around the chip stud 4. The heat of the semiconductor chip is transported to the chip stud 4, the dielectric liquid 11 around the chip stud 4 boils and generates bubbles 40. The bubbles 40 are trapped in the grooves between adjacent spiral fins 6'. The vapors 60 trapped in the grooves 62 condenses on the groove wall and is drawn toward a sharp corner 61 of the groove by capillary action. For this reason, the thickness of the liquid film between the vapor and groove wall is maintained to be relatively thin, and a high heat transfer coefficient of condensing is obtained. The condensed liquid drawn toward the sharp corner 61 now moves down the peripheral surface of the groove and is returned to the space 16 between the chip stud 4 and the spiral fin 6' by the force of gravity. In this manner, almost all of the vapor produced from each of the chips 2 condenses near the chip 2.

The recess of the cooling plate 3 in which the chip line 9 stud 4 is inserted has a large heat conducting area provided by the fins 6. Since fins 6 are used, provision of such a large heat conducting area does not resulting in any increase in the size of the cooling apparatus.

Although in this embodiment explanation is given to only the case where the chip stud 4 is secured to the back of the chip, it is also possible to make the chip stud 4 axially movable and while being pressed or urged by a spring.

We claim:

1. In a cooling apparatus cooling, by a boiling action of a dielectric liquid, integrated circuit chips mounted on printed circuit cards, each printed circuit card being submerged longitudinally in the dielectric liquid with a space provided therebetween, the cooling apparatus comprising stud means formed of a heat conductive material attached to a surface of respective integrated circuit chips promoting a boiling action to enhance a heat transfer efficiency to the dielectric liquid; cooling plate means arranged adjacent printed circuit cards in the cooling apparatus, the cooling plate means being cooled by a circulating cooling medium; a plurality of fin means attached to the cooling plate are formed of heat conductive material, and surround the circumference of each of the respective stud means; and a plurality of resilient members surrounding the respective stud means whereby vapor bubbles produced at lower integrated circuit chips or the stud means are trapped between the fin means and condensed such that vapor bubbles will not enter an area of another integrated circuit chips or stud means.

2. An integrated circuit chip cooling apparatus as defined in claim 1, wherein the fin means are formed as a flat plate.

3. An integrated circuit chip cooling apparatus, as defined in claim 1, wherein the fin means are formed as spiral fins.

4. An integrated circuit chip cooling apparatus, as defined in claim 1, wherein said stud means have a porous surface.

* * * * *